United States Patent
Kondo et al.

(10) Patent No.: US 8,841,728 B2
(45) Date of Patent: Sep. 23, 2014

(54) SEMICONDUCTOR DEVICE AND METHOD OF MANUFACTURING THE SAME

(71) Applicant: Kabushiki Kaisha Toshiba, Tokyo (JP)

(72) Inventors: Yoshiyuki Kondo, Yokohama (JP); Akira Hokazono, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/919,927

(22) Filed: Jun. 17, 2013

(65) Prior Publication Data

US 2014/0225170 A1 Aug. 14, 2014

(30) Foreign Application Priority Data

Feb. 14, 2013 (JP) ................... 2013-026301

(51) Int. Cl.
    *H01L 29/76* (2006.01)
    *H01L 21/28* (2006.01)
    *H01L 29/78* (2006.01)

(52) U.S. Cl.
    CPC ............... *H01L 29/78* (2013.01); *H01L 21/28* (2013.01)
    USPC ..................... 257/365; 257/366; 257/E21.421

(58) Field of Classification Search
    CPC .................................................. H01I 29/7831
    USPC ................... 257/365–366, E21.421
    See application file for complete search history.

(56) References Cited

U.S. PATENT DOCUMENTS

| | | | | |
|---|---|---|---|---|
| 4,716,446 | A * | 12/1987 | Esser et al. | 257/336 |
| 5,650,340 | A * | 7/1997 | Burr et al. | 438/286 |
| 8,120,115 | B2 | 2/2012 | Vandenberghe et al. | |
| 2007/0252212 | A1* | 11/2007 | Onsongo et al. | 257/355 |
| 2011/0227161 | A1* | 9/2011 | Zhu et al. | 257/365 |
| 2012/0161230 | A1* | 6/2012 | Satoh et al. | 257/335 |
| 2012/0205751 | A1 | 8/2012 | Ohguro | |
| 2012/0228706 | A1 | 9/2012 | Sugizaki et al. | |
| 2013/0134504 | A1 | 5/2013 | Kondo et al. | |

* cited by examiner

*Primary Examiner* — Matthew W Such
*Assistant Examiner* — Ali Naraghi
(74) *Attorney, Agent, or Firm* — Holtz Holtz Goodman & Chick PC

(57) ABSTRACT

In one embodiment, a semiconductor device includes a first diffusion layer of a first conductivity type and a second diffusion layer of a second conductivity type that are provided in a semiconductor layer at a distance, the second conductivity type being an opposite conductivity type of the first conductivity type, a first insulating film and a second insulating film that are provided on the semiconductor layer between the first diffusion layer and the second diffusion layer at a distance, a gate electrode provided on the first insulating film, and a threshold regulating electrode provided on the second insulating film.

14 Claims, 11 Drawing Sheets

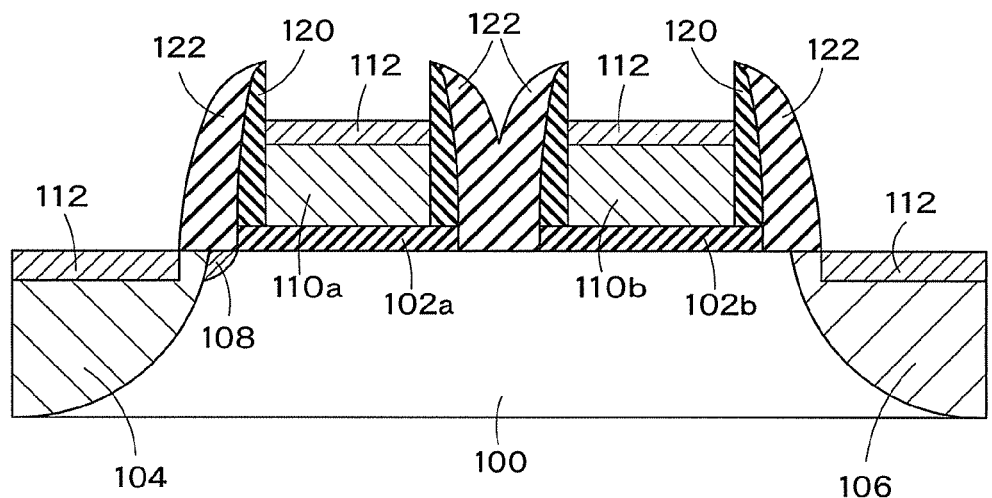
F I G. 1
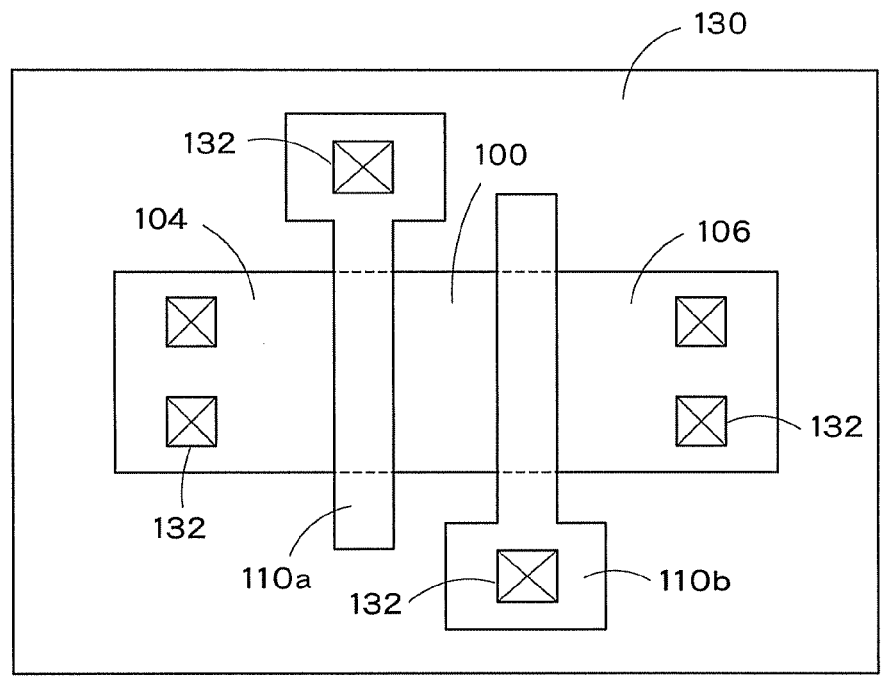
F I G. 2

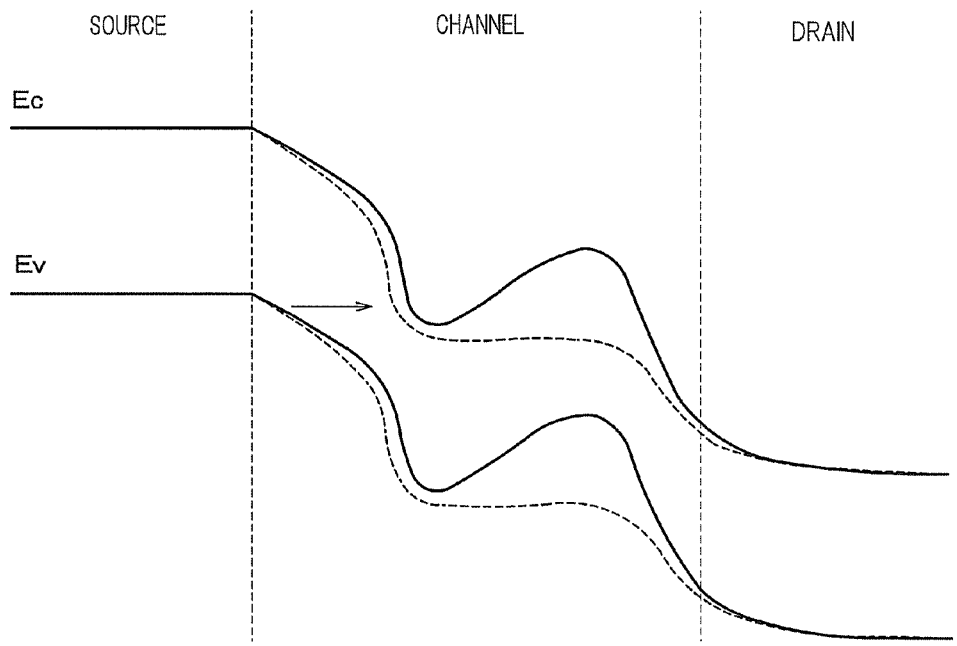
F I G. 3
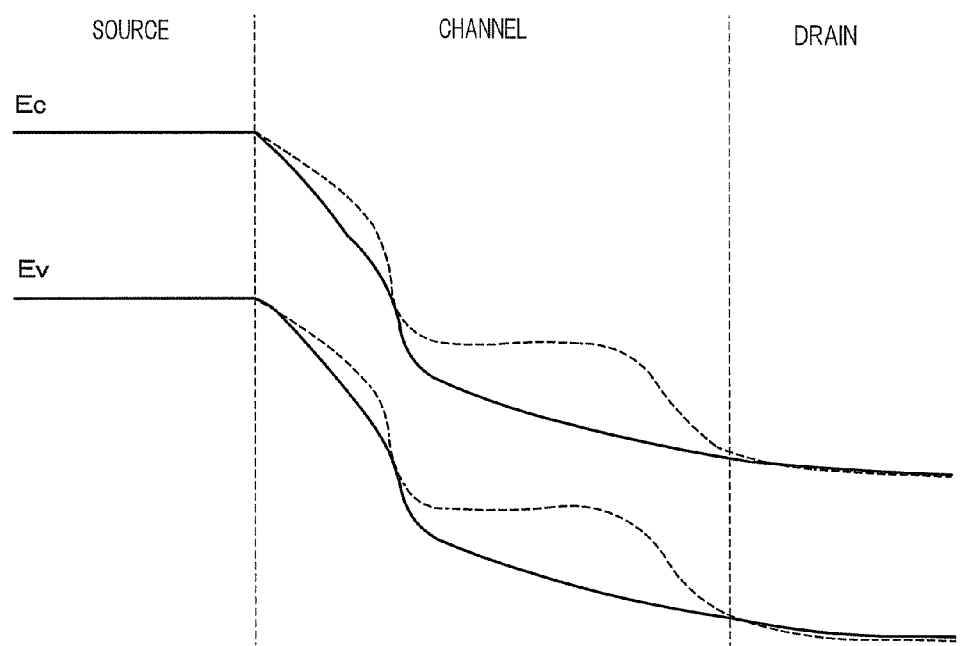
F I G. 4

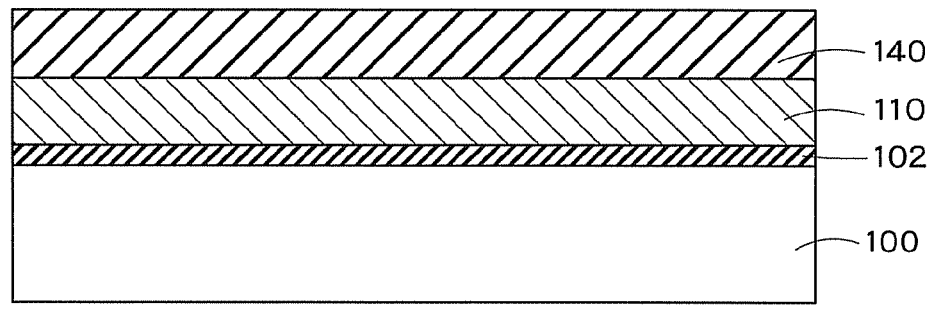
F I G. 5A
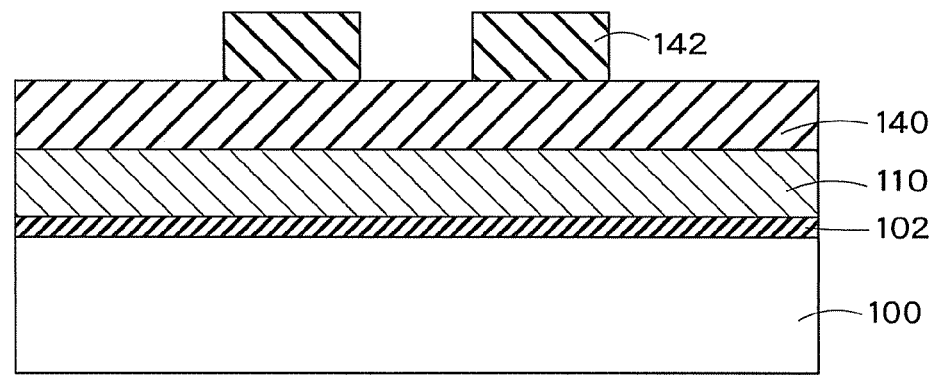
F I G. 5B
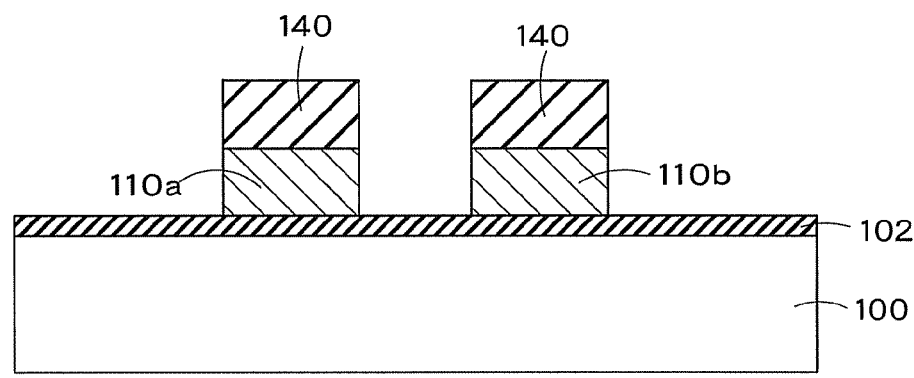
F I G. 5C

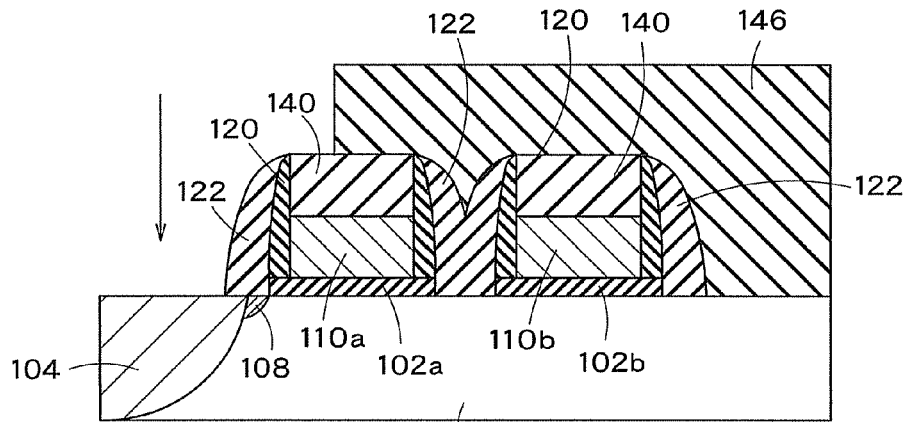
F I G. 5G
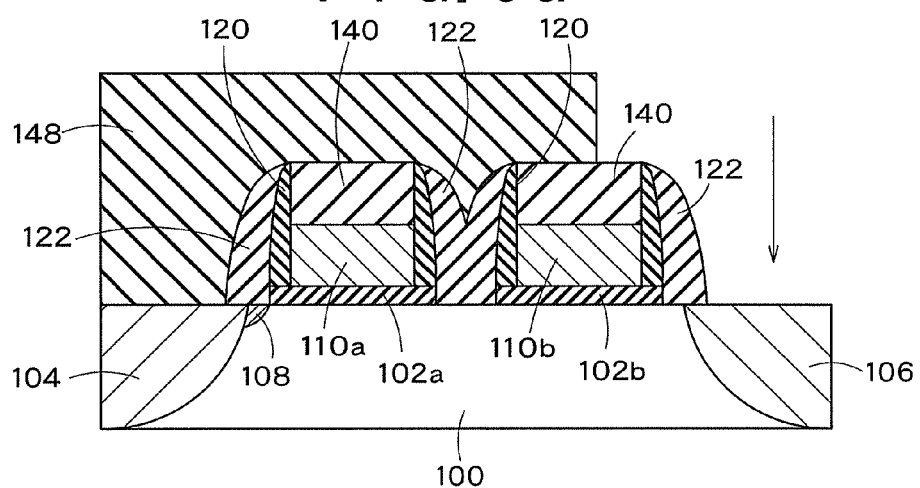
F I G. 5H
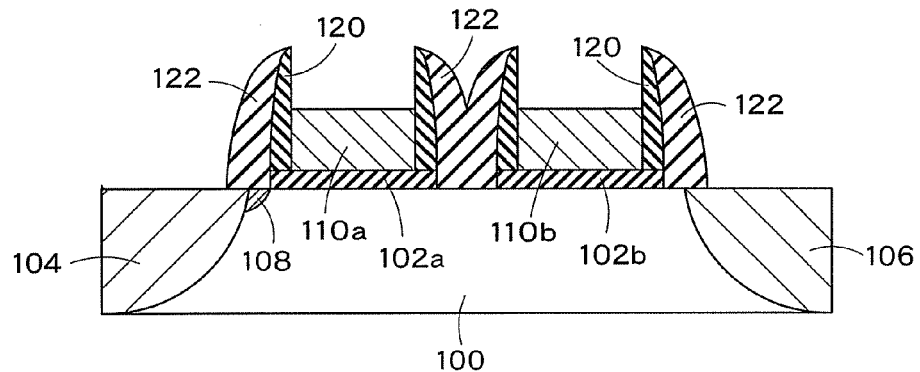
F I G. 5I

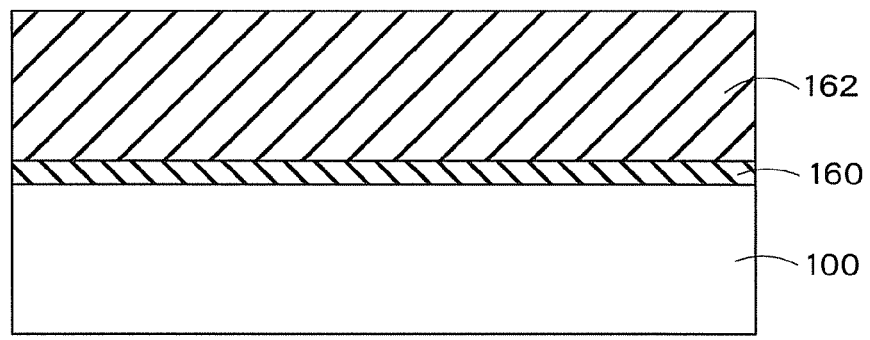
F I G. 6A
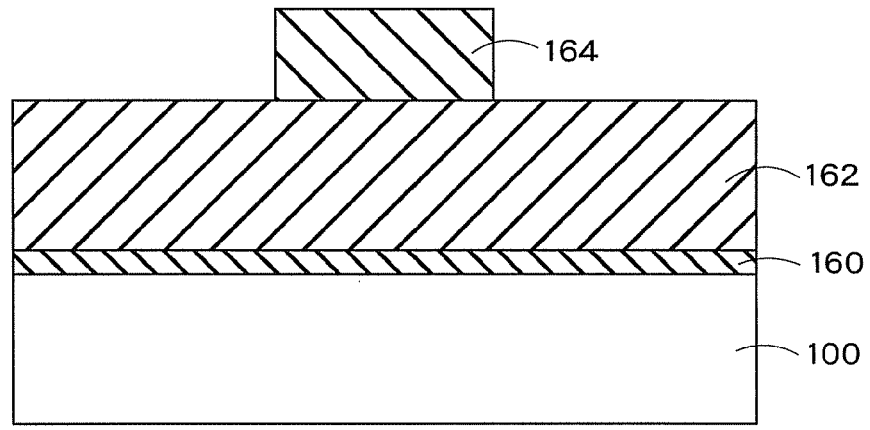
F I G. 6B
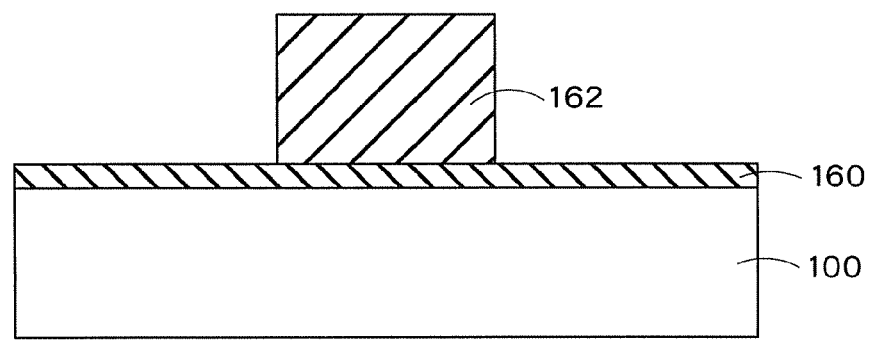
F I G. 6C

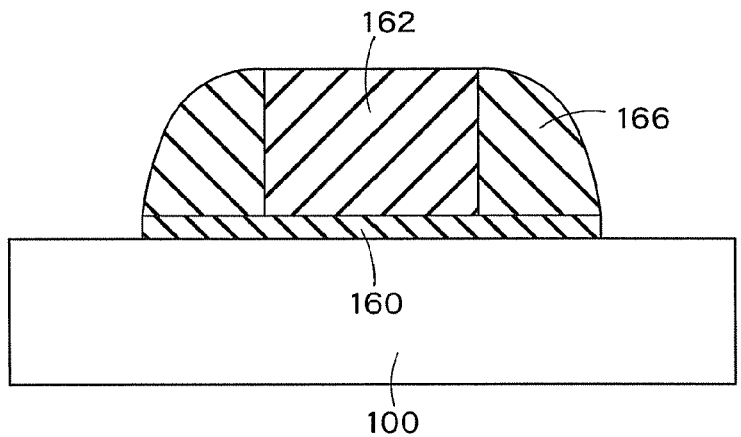
F I G. 6D
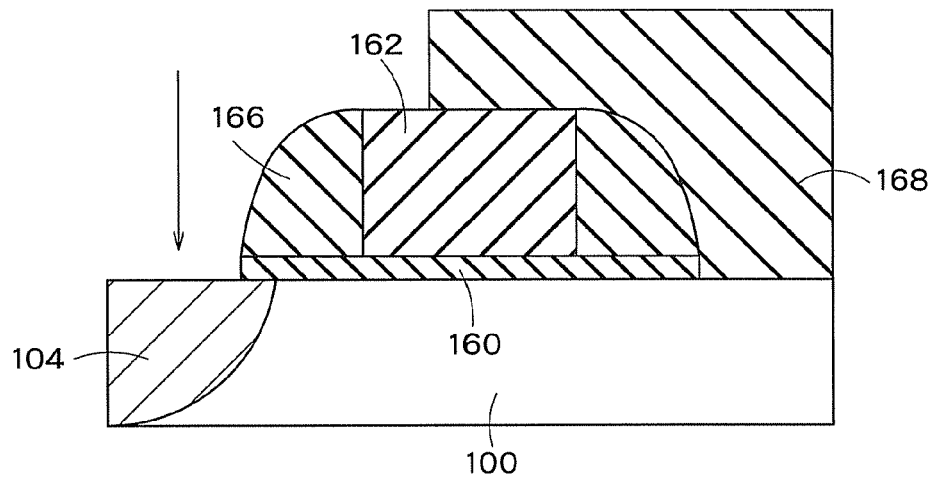
F I G. 6E
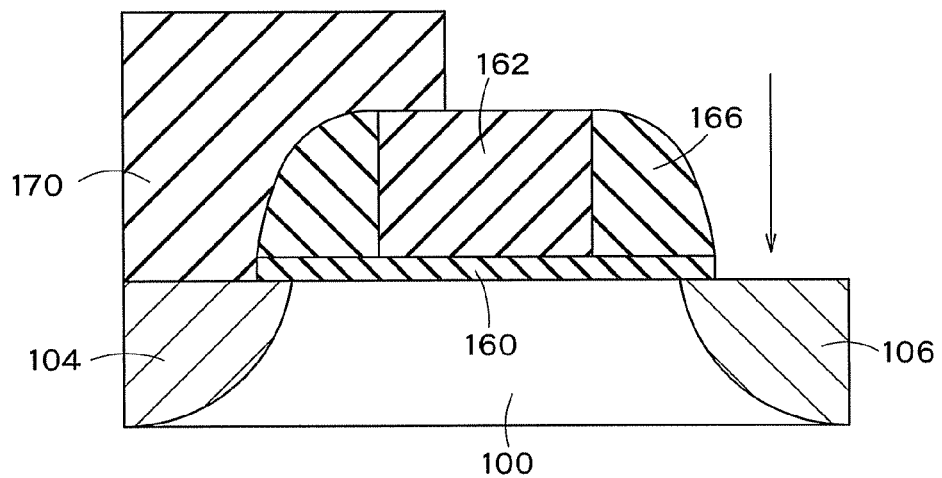
F I G. 6F

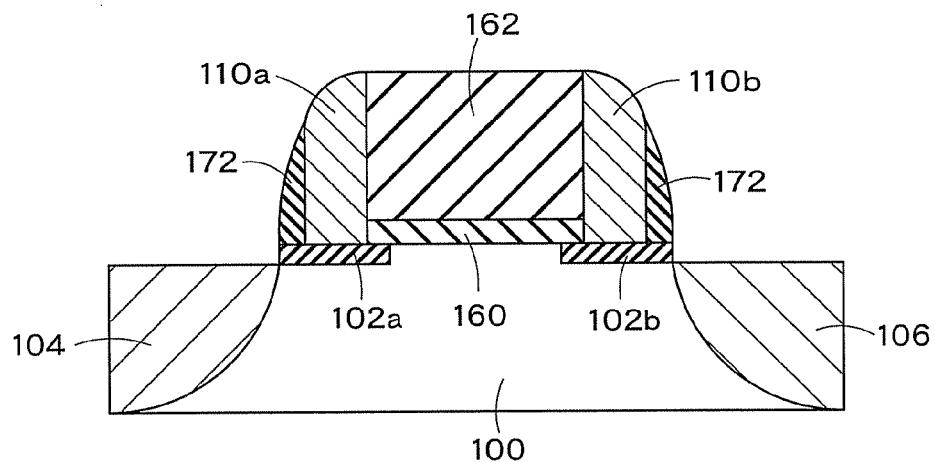
F I G. 6J
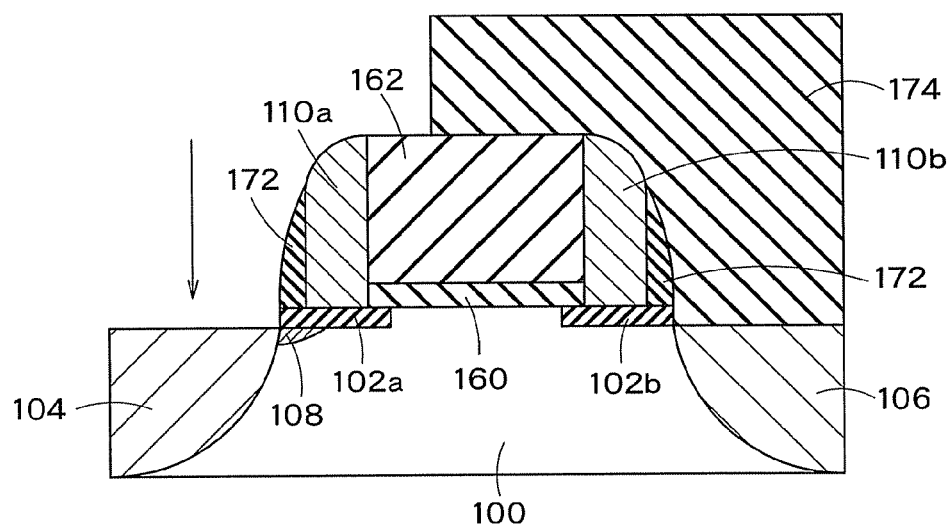
F I G. 6K
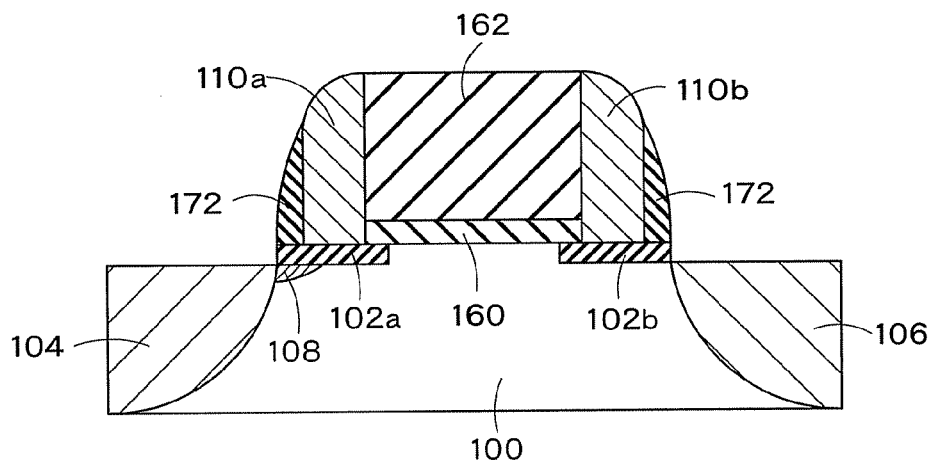
F I G. 6L

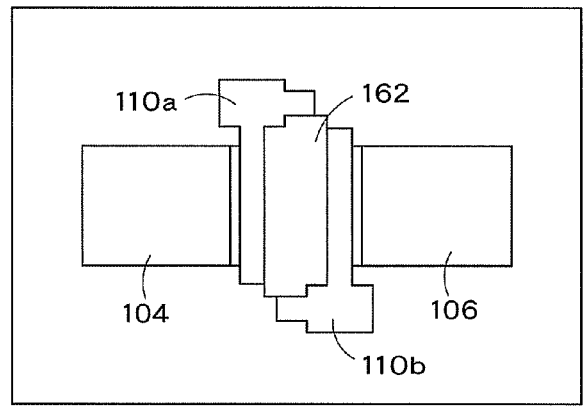
F I G. 7D
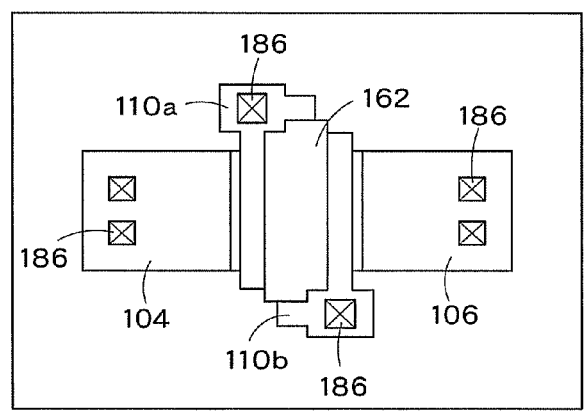
F I G. 7E
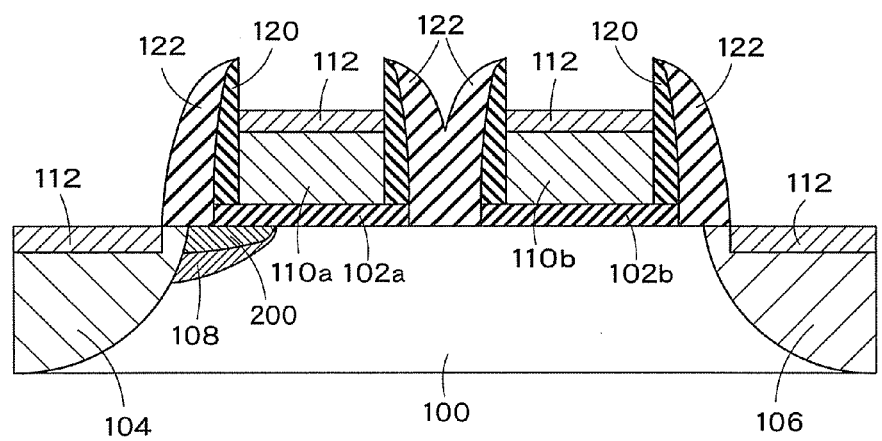
F I G. 8

2

SEMICONDUCTOR DEVICE AND METHOD OF MANUFACTURING THE SAME

CROSS REFERENCE TO RELATED APPLICATION

This application is based upon and claims benefit of priority from the Japanese Patent Application No. 2013-26301, filed on Feb. 14, 2013, the entire contents of which are incorporated herein by reference.

FIELD

Embodiments described herein relate generally to a semiconductor device and a method of manufacturing a semiconductor device.

BACKGROUND

A tunnel field effect transistor (TFET) is an LSI-applicable, low-power consumption transistor having different type between a source and a drain of a semiconductor, and an asymmetric diffusion layer. Since a sub-threshold swing (hereinafter, referred to as SS) steeper than that of a MOSFET can be obtained, TFET can realize a high on current and a low off current.

However, with the TFET having the steep SS, there are large variations in the off current. With the MOSFET, the variations in the off current can be restrained by regulating a threshold voltage by a body effect. However, since the TFET has a different impurity profile between the source and the drain, it is not possible to add a substrate electrode. Therefore, the threshold voltage of the TFET, which is constituted on a bulk substrate, is determined by the thickness of a gate insulating film (i.e., effective oxide thickness (EOT)) or a structural parameter such as junction abruptness of an impurity diffusion layer, and it is not possible to regulate the threshold voltage after completion of a device.

BRIEF DESCRIPTION OF THE DRAWINGS

FIG. 1 is a cross-sectional view of a semiconductor device according to a first embodiment;

FIG. 2 is a layout diagram of the semiconductor device according to the first embodiment;

FIG. 3 is an energy band graph of the semiconductor device according to the first embodiment;

FIG. 4 is an energy band graph of the semiconductor device according to the first embodiment;

FIGS. 5A to 5I are cross-sectional views illustrating a method of manufacturing the semiconductor device according to the first embodiment;

FIGS. 6A to 6L are cross-sectional views illustrating a method of manufacturing the semiconductor device according to a second embodiment;

FIGS. 7A to 7E are top views illustrating the method of manufacturing the semiconductor device according to the second embodiment; and FIG. 8 is a cross-sectional view of the semiconductor device according to a modification.

DETAILED DESCRIPTION

Figure 5D:
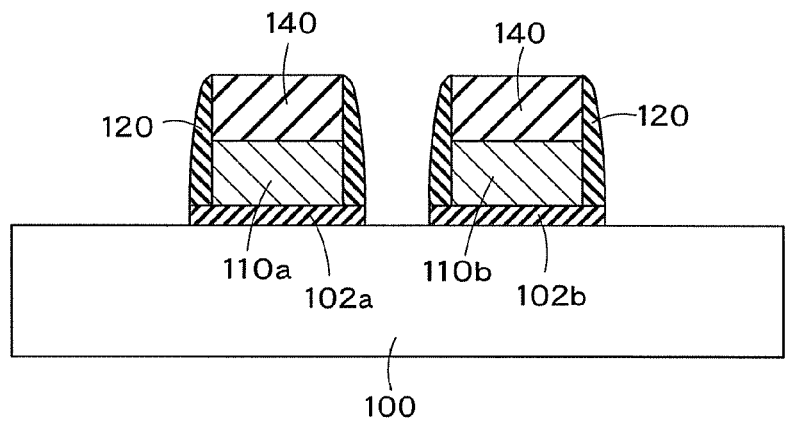

In one embodiment, a semiconductor device includes a first diffusion layer of a first conductivity type and a second diffusion layer of a second conductivity type that are provided in a semiconductor layer at a distance, the second conductivity type being an opposite conductivity type of the first conductivity type, a first insulating film and a second insulating film that are provided on the semiconductor layer between the first diffusion layer and the second diffusion layer at a distance, a gate electrode provided on the first insulating film, and a threshold regulating electrode provided on the second insulating film.

Embodiments will now be explained with reference to the accompanying drawings.

First Embodiment

FIG. 1 is a cross-sectional view of a semiconductor device according to a first embodiment. The semiconductor device is an n-type tunnel transistor including: a gate insulating film 102a and an insulating film 102b, which are formed on a semiconductor substrate (semiconductor layer) 100 at a predetermined distance; a gate electrode 110a formed on the gate insulating film 102a; a threshold regulating electrode 110b formed on the insulating film 102b; and a p-type source region (source electrode) 104 and an n-type drain region (drain electrode) 106, which are formed inside the semiconductor substrate 100 so as to sandwich the gate electrode 110a and the threshold regulating electrode 110b.

The threshold regulating electrode 110b is an electrode for regulating a threshold potential of the tunnel transistor, and details thereof will be described later.

The semiconductor substrate 100 is, for example, a silicon wafer, and may be a layer doped with a p-type impurity with a low concentration.

A first sidewall insulating film 120 and a second sidewall insulating film 122 are formed on sidewalls of the gate electrode 110a and the threshold regulating electrode 110b. As in FIG. 1, the second sidewall insulating film 122 provided on one side of the gate electrode 110a (right side in the figure) may come in contact with the second sidewall insulating film 122 provided on one side of the threshold regulating electrode 110b (left side in the figure).

Between the source region 104 and the drain region 106, a p-type source extension region 108 is formed adjacent to the source region 104. The source extension region 108 is formed on the surface of the semiconductor substrate 100, and has the same type as the source region 104. The source extension region 108 may extend to below an edge of the gate electrode 110a.

A silicide layer 112 is formed on each of upper surfaces of the source region 104, the drain region 106, the gate electrode 110a, and the threshold regulating electrode 110b.

FIG. 2 is an exemplary layout of this semiconductor device. The semiconductor device is surrounded by an element isolation region 130, and contact plugs 132 are provided to the gate electrode 110a, the threshold regulating electrode 110b, the source region 104, and the drain region 106. Different voltages may be applied to the gate electrode 110a and the threshold regulating electrode 110b. In FIG. 2, a gate insulating film, a sidewall insulating film, and the like are omitted and not shown for convenience of description.

Next, a method of regulating a threshold of the tunnel transistor according to this embodiment is described. When the source electrode 104 is set to 0 V and the drain electrode 106 is given a positive potential, a value of a current flowing between the source and the drain is changed based on the potential given to the gate electrode 110a and the threshold regulating electrode 110b. When the gate electrode 110a and the threshold regulating electrode 110b are given 0 V, an off state having a very small current value is realized.

FIG. 3 is an energy band graph illustrating a case where the gate electrode 110a is given the positive potential. Solid lines denote a case where the potential below 0 V (negative potential relative to the source electrode 104) is applied to the threshold regulating electrode 110b. Dashed lines in FIG. 3 denote a case where the threshold regulating electrode 110b is omitted from a configuration. Here, Ec denotes (the lowest) energy of a conduction band, and Ev denotes (the highest) energy of a valence band.

As shown with the dashed lines in FIG. 3, when the lowest energy of the conduction band of a channel falls below the highest energy of the valence band of the source, an electron occupying the valence band of the source moves to the conduction band of the channel, whereby band-to-band tunneling (BTBT) occurs. When this tunneled electron moves to the conduction band of the channel, the electron is affected by an electric field and concentration gradient, and is conveyed until reaching the drain electrode, whereby a current is flowed. In the meantime, in the valence band in the source, a hole is generated after the tunneling. This hole reaches the source electrode following the electric field and concentration gradient in the source. Accordingly, an on state is realized.

However, as shown with the solid lines in FIG. 3, when the threshold regulating electrode 110b is applied with the negative potential relative to the source electrode 104, even if the BTBT from the valence band of the source electrode to the conduction band in the channel occurs, a barrier existing in the threshold regulating electrode 110b makes it difficult for an electron in the channel to reach the drain electrode. Therefore, an off state in which no current is flowed is realized. This is equivalent to increasing a threshold voltage of the tunnel transistor.

In the energy band graph in FIG. 4, solid lines show a case where the positive potential is given to the gate electrode 110a, and the potential larger than 0 V (positive potential relative to the source electrode 104) is applied to the threshold regulating electrode 110b. Dashed lines in FIG. 4, same as the dashed lines in FIG. 3, show a case where the threshold regulating electrode 110b is omitted from the configuration.

As shown with the solid lines in FIG. 4, in the case where the positive potential relative to the source electrode 104 is applied to the threshold regulating electrode 110b, a tunnel barrier of the BTBT can be set to be thinner. In other words, a band in the channel is bent in a direction to facilitate tunneling of the electron. This is equivalent to decreasing the threshold voltage of the tunnel transistor.

In this way, the threshold voltage of the tunnel transistor can be regulated by changing the potential applied to the threshold regulating electrode 110b.

Next, the method of manufacturing the semiconductor device according to this embodiment is described using FIGS. 5A to 5I.

First, as in FIG. 5A, in an intended region of a silicon wafer to be the semiconductor substrate 100, an element isolation region (not shown) is formed by using, for example, the shallow trench isolation (STI) method. Next, on an element forming region of the silicon wafer, a silicon oxide film 102, which is to become the gate insulating film 102a and the insulating film 102b, is formed by the thermal oxidation method.

A silicon-on-insulator (SOI) substrate or a germanium-on-insulator (GeOI) substrate may be used instead of the silicon wafer. Furthermore, a silicon oxynitride film or a high-k insulating film may be used instead of the silicon oxide film.

Subsequently, on the silicon oxide film 102, an electrode material 110, which is to become the gate electrode 110a and the threshold regulating electrode 110b, is deposited by the chemical vapor deposition (CVD). The electrode material 110 is, for example, polysilicon, which is doped with an n-type impurity such as phosphorus. As the electrode material 110, an amorphous silicon film doped with the phosphorus may be used. A metal gate may also be used.

An insulating film (gate hard mask material) 140 such as a $Si_3N_4$ film is further formed on the electrode material 110.

Next, as in FIG. 5B, a resist is applied on the insulating film 140, and a resist pattern 142 is formed by a lithographic treatment. The resist pattern 142 is a pattern shape corresponding to the gate electrode 110a and the threshold regulating electrode 110b.

Next, as in FIG. 5C, using the resist pattern 142 as a mask, the insulating film 140 is processed by the reactive ion etching (RIE). Then, the electrode material 110 is processed using the insulating film 140 as the mask. As a result, the gate electrode 110a and the threshold regulating electrode 110b are formed. The resist pattern 142 may be peeled off before the gate electrode 110a and the threshold regulating electrode 110b are formed.

Next, as in FIG. 5D, an insulating film such as of TEOS is deposited on an entire surface of the wafer by the CVD method. The insulating film is anisotropically etched by the RIE method to form first sidewall insulating films 120, to be an offset spacer, on both sidewalls of the gate electrode 110a and the threshold regulating electrode 110b. At this time, the silicon oxide film 102 is also processed, and the gate insulating film 102a and the insulating film 102b are obtained.

Figure 5E:
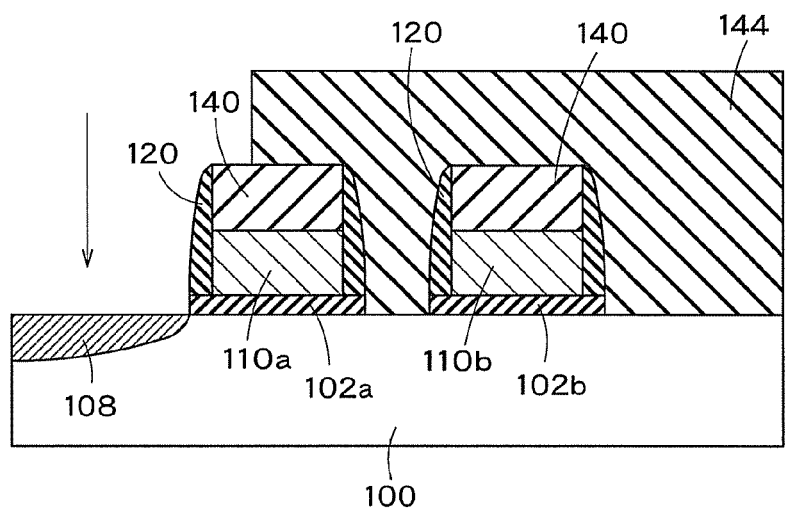

Next, as in FIG. 5E, a resist 144, which covers the drain side, is formed by the lithographic method. Then, ion implantation is performed to form a source extension region 108. At this time, an ionic species of B, $BF_2$, or the like is used. After the resist 144 has been peeled off, the impurity is activated by, for example, the rapid thermal annealing (RTA).

At this time, a p-n junction may be formed in a vertical direction in the source extension region 108. The p-n junction in the vertical direction can be formed, for example, by performing the ion implantation of an n-type impurity such as As with low accelerating energy immediately after the ion implantation of the above-described B, $BF_2$, or the like.

In the ion implantation, a beam may be tilted against the semiconductor substrate 100 so that ions are implanted extending to below the gate electrode 110a.

Figure 5F:
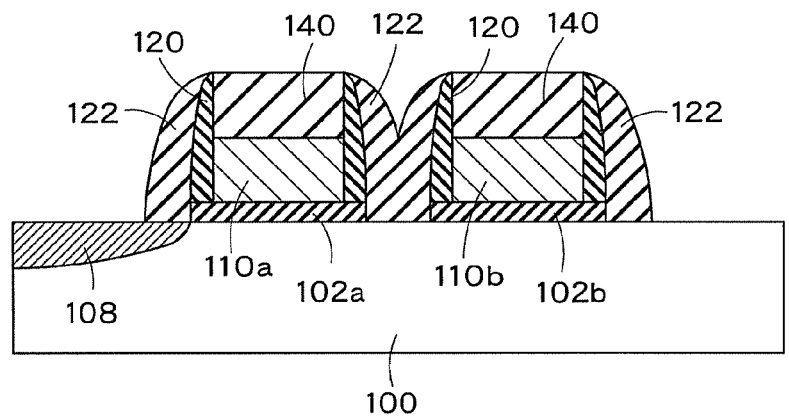

Next, as in FIG. 5F, an insulating film such as of TEOS is deposited on the entire surface of the wafer by the CVD method. Then, the TEOS film is anisotropically etched by the RIE method to form second sidewall insulating films 122 on both sidewalls of the gate electrode 110a and the threshold regulating electrode 110b.

Next, as in FIG. 5G, a resist 146, which covers the drain side, is formed by the lithographic method. Then, the ion implantation is performed to form the source region 104. The ionic species of B, $BF_2$, or the like is used. The ion implantation in this process is performed with higher accelerating energy than that in the ion implantation in the process in FIG. 5E.

Next, as in FIG. 5H, after the resist 146 has been peeled off, a resist 148, which covers the source side, is formed by the lithographic method. Then, the ion implantation is performed to form the drain region 106. At this time, the ionic species of As, P, or the like is used.

Then, after the resist 148 has been peeled off, the impurity is activated by an annealing treatment such as RTA.

Next, as in FIG. 5I, the insulating films 140 on the gate electrode 110a and the threshold regulating electrode 110b are selectively peeled off by wet etching.

Subsequently, a silicide layer 112 is formed by a salicide process (see FIG. 1) in a self-aligning manner. The silicide layer 112 is, for example, an alloy with low-resistance silicon such as NiSi, NiSi$_2$, or Co$_2$Si.

In this way, as in FIG. 1, the tunnel transistor having the threshold regulating electrode 110b provided at a distance from the gate electrode 110a is manufactured. The threshold voltage of the tunnel transistor can be regulated based on the potential applied to the threshold regulating electrode 110b.

Second Embodiment

In the above first embodiment, the insulating films (first sidewall insulating film 120, second sidewall insulating film 122) are formed between the gate electrode 110a and the threshold regulating electrode 110b after the gate electrode 110a and the threshold regulating electrode 110b have been formed. However, it is also possible to form an insulating film on a semiconductor substrate, and to form a gate electrode 110a on one sidewall of this insulating film, and a threshold regulating electrode 110b on the other sidewall. A method of manufacturing the tunnel transistor in this way is described by using FIGS. 6A to 6L.

First, as in FIG. 6A, in an intended region of a silicon wafer to be a semiconductor substrate 100, an element isolation region (not shown) is formed by using, for example, the STI method. Next, on an element forming region of the silicon wafer, a silicon oxide film 160 is formed, for example, by the thermal oxidation method. Then, on the silicon oxide film 160, an insulating film 162 such as a Si$_3$N$_4$ film is formed.

Next, as in FIG. 6B, a resist is applied on the insulating film 162, and a resist pattern 164 is formed by a lithographic treatment. The resist pattern 164 is a pattern shape corresponding to an insulating film, which separates the gate electrode 110a and the threshold regulating electrode 110b.

Next, as in FIG. 6C, using the resist pattern 164 as a mask, the insulating film 162 is processed, for example, by the RIE method. Then, the resist pattern 164 is peeled off.

Next, as in FIG. 6D, an insulating film such as of TEOS is formed on an entire surface of the wafer by the CVD method. Then, the TEOS film is anisotropically etched by the RIE method, and a sidewall insulating film 166 is formed on a sidewall of the insulating film 162. At this time, the silicon oxide film 160 is also processed.

Next, as in FIG. 6E, a resist 168, which covers the drain side, is formed by the lithographic method. Then, ion implantation is performed to form a source region 104. The ionic species of B, BF$_2$, or the like is used.

Next, as in FIG. 6F, after the resist 168 has been peeled off, a resist 170, which covers the source side, is formed by the lithographic method. Then, the ion implantation is performed to form a drain region 106. The ionic species of As, P, or the like is used.

After the resist 170 has been peeled off, impurity is activated by an annealing treatment such as RTA.

Figure 6G:
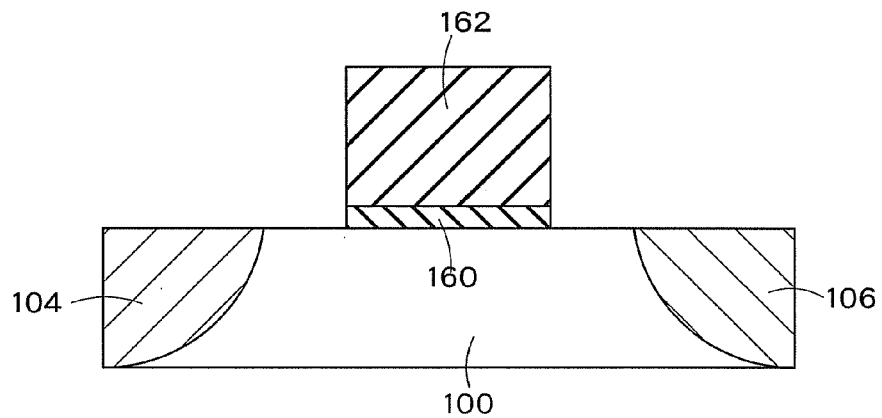

Next, as in FIG. 6G, the sidewall insulating film 166 is selectively peeled off by the wet etching.

Figure 6H:
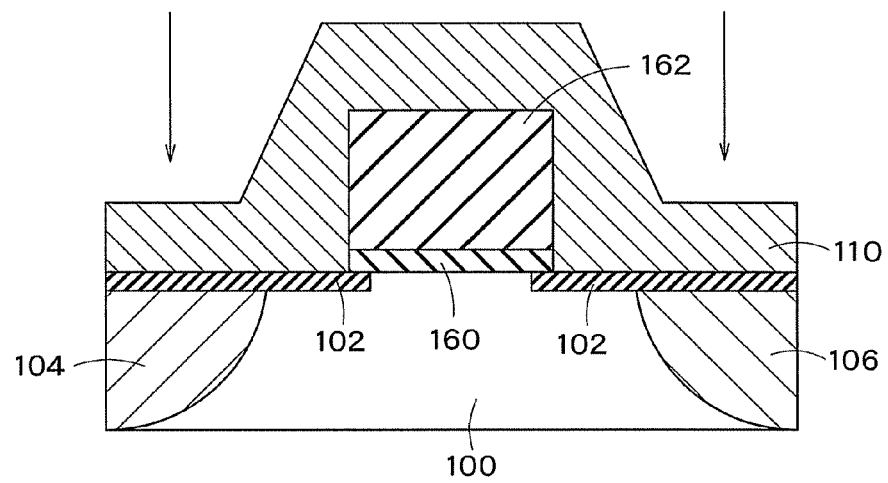

Next, as in FIG. 6H, a silicon oxide film 102, to be a gate insulating film, is formed on the surface of the wafer by the thermal oxidation method. Subsequently, a film of polysilicon 110 is formed on the entire surface of the wafer, for example, by the CVD method. At this time, the film thickness of the polysilicon 110 is set to be thinner than the film thickness of the TEOS film formed in the process in FIG. 6D.

Subsequently, the polysilicon 110 is doped with an n-type impurity. Then, the impurity is diffused and activated by the annealing treatment such as the RTA.

In this process, instead of film formation of the polysilicon 110 and the impurity implantation, for example, an amorphous silicon film doped with phosphorus may be formed.

Figure 6I:
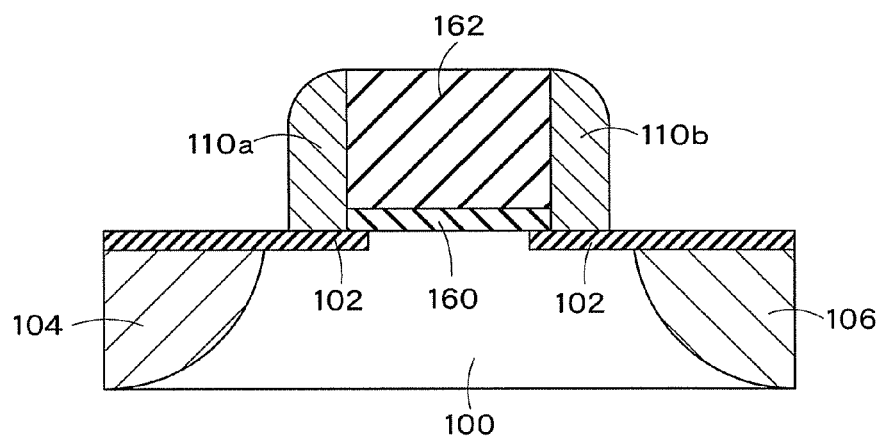

Next, as in FIG. 6I, the polysilicon 110 is anisotropically etched by the RIE method to form a gate electrode 110a on one sidewall of the insulating film 162, and a threshold regulating electrode 110b on the other sidewall.

Next, as in FIG. 6J, an insulating film such as of TEOS is formed on the entire surface of the wafer, for example, by the CVD method. Then, a sidewall insulating film 172, to be an offset spacer, is formed by anisotropically etching the TEOS film by the RIE method. Along with the formation of the sidewall insulating film 172, the silicon oxide film 102 is processed, and a gate insulating film 102a and an insulating film 102b are formed.

Next, as in FIG. 6K, a resist 174 is formed, so as to cover the drain side, by a lithographic method. Then, the ion implantation is performed to form a source extension region 108. The ionic species of B, BF$_2$, or the like is used. The ion implantation in this process is performed with lower accelerating energy than that in the ion implantation in the process in FIG. 6E.

It is also possible to form a drain extension region of an n-type impurity on the drain side using the same method.

Next, as in FIG. 6L, after the resist 174 has been peeled off, the impurity is activated by the annealing treatment such as the RTA.

A method of forming a contact plug in such a tunnel transistor is described herein by using the top views in FIGS. 7A to 7E.

Figure 7A:
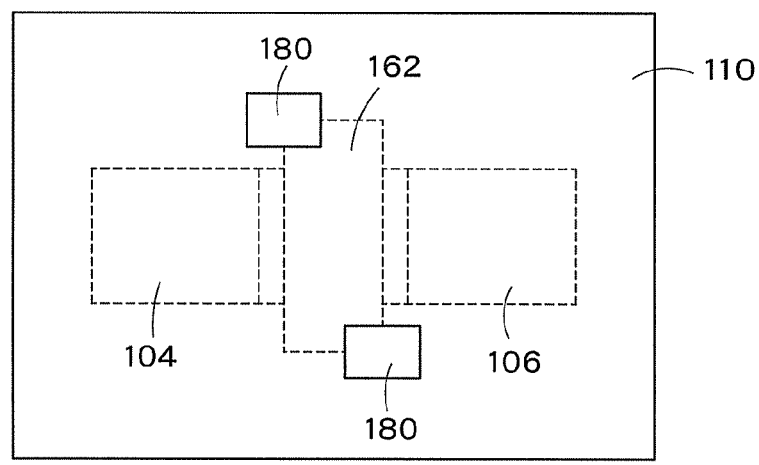

After the film of the polysilicon 110 has been formed as in FIG. 6H, and before the etching of the polysilicon 110 as in FIG. 6I, a resist 180 is formed by the lithographic method as in FIG. 7A. The resist 180 is formed in a region where the contact plugs are provided in the gate electrode 110a and the threshold regulating electrode 110b. In the case where a shape of an upper surface of the insulating film 162 is a rectangle, in order to secure a contact forming region, it is preferable that the resist 180 be formed in two places at opposite vertices of the insulating film 162.

Figure 7B:
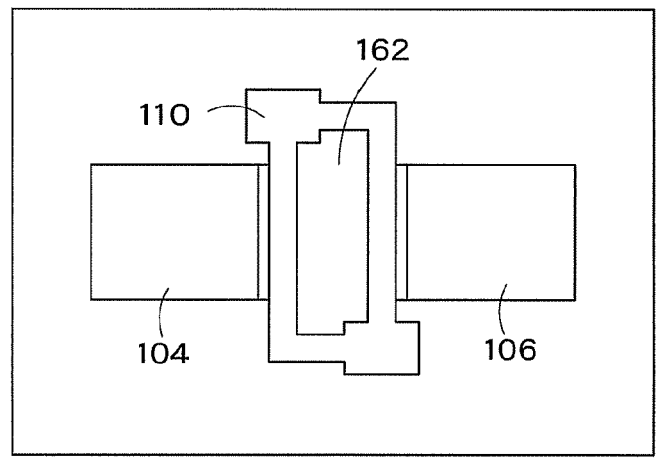

By the etching of the polysilicon 110 as in FIG. 6I, the polysilicon 110 below the resist 180 remains as in FIG. 7B. At this time, the polysilicon 110 is formed so as to surround the insulating film 162.

Figure 7C:
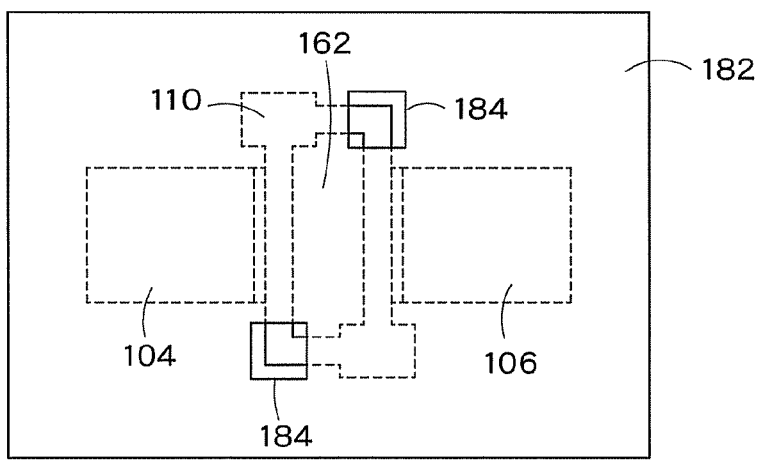

Next, a resist 182 is formed as in FIG. 7C, and an opening 184 is formed by the lithographic treatment. It is preferable that the opening 184 be formed in two places at opposite vertices, different from the resist 180, of the insulating film 162.

Next, as in FIG. 7D, using the resist 182 as the mask, a part of the polysilicon 110 exposed through the opening 184 is removed by the RIE method. As a result, the polysilicon 110 surrounding the insulating film 162 is separated into the gate electrode 110a and the threshold regulating electrode 110b. The processes in FIGS. 7C and 7D are implemented, for example, after the process in FIG. 6I and before the process in FIG. 6J.

After the impurity activation in FIG. 6L, forming of an interlayer insulating film, forming of a contact hole, forming of a metal film inside the contact hole, and the like are performed. Then, as in FIG. 7E, contact plugs 186 for the gate electrode 110a, the threshold regulating electrode 110b, the source region 104, and the drain region 106 are formed.

In this way, the tunnel transistor having the gate electrode 110a and the threshold regulating electrode 110b formed on the sidewall of the insulating film 162 can be manufactured. In the same way as the above-described first embodiment, a threshold voltage of the tunnel transistor can be regulated based on the potential applied to the threshold regulating electrode 110b.

Furthermore, according to this embodiment, the heights of the gate electrode 110a and the threshold regulating electrode 110b as well as a distance between these electrodes can be varied by changing the thickness and the width of the insulating film 162. Therefore, it is possible to form a tunnel transistor having a characteristic suitable for a different purpose from a single pattern.

In the above-described first and second embodiments, a p-i-n type tunnel transistor, which has a p-n junction in a horizontal direction at a source side, has been described; however, a p-n-i-n type tunnel transistor may also be used. The p-n-i-n type tunnel transistor has the p-n junction in a vertical direction at a source side by inserting, on the source side, a pocket region having an opposite conductivity of the source. For example, as in FIG. 8, a pocket region 200 may be provided in the tunnel transistor according to the above-described first embodiment. The pocket region 200 is formed on the surface of the semiconductor substrate 100, and is extended to below an edge of the gate electrode 110a. After the source extension region 108 has been formed, the ion implantation using arsenic or phosphorus is performed to form the pocket region 200 on the surface of the semiconductor substrate 100. As in FIG. 8, at least a part of the pocket region 200 is covered by the source extension region 108.

In the above embodiment, conductivity of the gate electrode 110a may be different from that of the threshold regulating electrode 110b. For example, by making the gate electrode 110a n-type, and the threshold regulating electrode 110b p-type, a work function of the threshold regulating electrode 110b becomes larger than a work function of the gate electrode 110a. This is suitable in the case where the threshold voltage of the tunnel transistor is preferred to be high, for example, where the tunnel transistor is applied in a circuit that is frequently turned off.

Furthermore, in the above embodiment, the film thickness may be varied between the gate insulating film 102a and the insulating film 102b. For example, the film thickness of the insulating film 102b below, the threshold regulating electrode 110b is made larger than the film thickness of the gate insulating film 102a below the gate electrode 110a. In this way, a gate leak can be effectively prevented.

In the above embodiment, an n-type tunnel transistor has been described; however, the embodiment is also applicable to a p-type tunnel transistor by reversing the conductivity of each part.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first diffusion layer of a first conductivity type and a second diffusion layer of a second conductivity type that are provided in a semiconductor layer at a distance, the second conductivity type being an opposite conductivity type of the first conductivity type;
   a first insulating film and a second insulating film that are provided on the semiconductor layer between the first diffusion layer and the second diffusion layer at a distance;
   a gate electrode provided on the first insulating film; and
   a threshold regulating electrode provided on the second insulating film;
   wherein an extension region of the first conductivity type is provided adjacent to the first diffusion layer; and
   wherein a pocket region of the second conductivity type is provided adjacent to the first diffusion layer on a surface of the semiconductor layer, and the extension region covers at least a part of the pocket region.

2. The semiconductor device according to claim 1, further comprising:
   a third insulating film provided between the first insulating film and the second insulating film,
   wherein the gate electrode is provided on one sidewall of the third insulating film, and
   wherein the threshold regulating electrode is provided on another sidewall of the third insulating film.

3. The semiconductor device according to claim 1, wherein the threshold regulating electrode is applied with a potential different from a potential applied to the gate electrode.

4. The semiconductor device according to claim 1, wherein the gate electrode has a conductivity type different from a conductivity type of the threshold regulating electrode.

5. The semiconductor device according to claim 4, wherein the first conductivity type is p-type and the second conductivity type is n-type, and
   the gate electrode is of n-type and the threshold regulating electrode is of p-type.

6. The semiconductor device according to claim 1, wherein a sidewall insulating film is provided on a sidewall of the gate electrode and on a sidewall of the threshold regulating electrode.

7. A semiconductor device comprising:
   a first diffusion layer of a first conductivity type and a second diffusion layer of a second conductivity type that are provided in a semiconductor layer at a distance, the second conductivity type being an opposite conductivity type of the first conductivity type;
   a first insulating film and a second insulating film that are provided on the semiconductor layer between the first diffusion layer and the second diffusion layer at a distance;
   a gate electrode provided on the first insulating film; and
   a threshold regulating electrode provided on the second insulating film;
   wherein a film thickness of the second insulating film is larger than a film thickness of the first insulating film.

8. The semiconductor device according to claim 7, further comprising:
   a third insulating film provided between the first insulating film and the second insulating film,
   wherein the gate electrode is provided on one sidewall of the third insulating film, and
   wherein the threshold regulating electrode is provided on another sidewall of the third insulating film.

9. The semiconductor device according to claim 7, wherein the threshold regulating electrode is applied with a potential different from a potential applied to the gate electrode.

10. The semiconductor device according to claim 7, wherein an extension region of the first conductivity type is provided adjacent to the first diffusion layer.

11. The semiconductor device according to claim 10, wherein a pocket region of the second conductivity type is provided adjacent to the first diffusion layer on a surface of the semiconductor layer, and the extension region covers at least a part of the pocket region.

12. The semiconductor device according to claim 7, wherein the gate electrode has a conductivity type different from a conductivity type of the threshold regulating electrode.

13. The semiconductor device according to claim 12, wherein the first conductivity type is p-type and the second conductivity type is n-type, and the gate electrode is of n-type and the threshold regulating electrode is of p-type.

14. The semiconductor device according to claim 7, wherein a sidewall insulating film is provided on a sidewall of the gate electrode and on a sidewall of the threshold regulating electrode.

* * * * *